US006911707B2

(12) United States Patent
Gardner et al.

(10) Patent No.: US 6,911,707 B2
(45) Date of Patent: Jun. 28, 2005

(54) ULTRATHIN HIGH-K GATE DIELECTRIC WITH FAVORABLE INTERFACE PROPERTIES FOR IMPROVED SEMICONDUCTOR DEVICE PERFORMANCE

(75) Inventors: Mark I. Gardner, Cedar Creek, TX (US); Dim-Lee Kwong, Austin, TX (US); H. Jim Fulford, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 307 days.

(21) Appl. No.: 09/207,972

(22) Filed: Dec. 9, 1998

(65) Prior Publication Data

US 2003/0057432 A1 Mar. 27, 2003

(51) Int. Cl.[7] ............................................. H01L 29/76
(52) U.S. Cl. ........................ 257/410; 257/324; 257/325; 257/639; 257/640; 257/649
(58) Field of Search ............................... 257/410, 324, 257/325, 639, 640, 649

(56) References Cited

U.S. PATENT DOCUMENTS

| | | | | |
|---|---|---|---|---|
| 4,851,370 A | | 7/1989 | Doklan et al. | |
| 5,591,681 A | * | 1/1997 | Wristers et al. | 437/240 |
| 5,596,214 A | * | 1/1997 | Endo | 257/324 |
| 5,648,284 A | * | 7/1997 | Kusunoki et al. | 437/40 |
| 5,880,508 A | * | 3/1999 | Wu | 257/368 |
| 5,972,751 A | * | 10/1999 | Ramsbey et al. | 438/257 |
| 5,994,734 A | * | 11/1999 | Chou | 257/316 |
| 6,015,739 A | * | 1/2000 | Gardner et al. | 438/287 |
| 6,320,238 B1 | * | 11/2001 | Kizilyalli et al. | 257/295 |
| 6,548,854 B1 | * | 4/2003 | Kizilyalli et al. | 257/295 |

* cited by examiner

Primary Examiner—Tom Thomas
Assistant Examiner—Matthew E. Warren
(74) Attorney, Agent, or Firm—Robert C. Kowert; Meyertons, Hood, Kivlin, Kowert & Goetzel, P.C.

(57) ABSTRACT

An ultrathin gate dielectric having a graded dielectric constant and a method for forming the same are provided. The gate dielectric is believed to allow enhanced performance of semiconductor devices including transistors and dual-gate memory cells. A thin nitrogen-containing oxide, preferably having a thickness of less than about 10 angstroms, is formed on a semiconductor substrate. A silicon nitride layer having a thickness of less than about 30 angstroms may be formed over the nitrogen-containing oxide. The oxide and nitride layers are annealed in ammonia and nitrous oxide ambients, and the nitride layer thickness is reduced using a flowing-gas etch process. The resulting two-layer gate dielectric is believed to provide increased capacitance as compared to a silicon dioxide dielectric while maintaining favorable interface properties with the underlying substrate. In an alternative embodiment, a different high dielectric constant material is substituted for the silicon nitride. Alternatively, both nitride and a different high dielectric constant material may be used so that a three-layer dielectric is formed.

33 Claims, 4 Drawing Sheets

ULTRATHIN HIGH-K GATE DIELECTRIC WITH FAVORABLE INTERFACE PROPERTIES FOR IMPROVED SEMICONDUCTOR DEVICE PERFORMANCE

BACKGROUND OF THE INVENTION

1. Field of the Invention

This invention relates to integrated circuit fabrication and, more particularly, to a gate dielectric having a high dielectric constant and favorable interface properties with underlying semiconductor regions, and to a method for producing this gate dielectric by combining deposition, annealing, and etchback techniques.

2. Description of the Relevant Art

Fabrication of a metal-oxide-semiconductor (MOS) integrated circuit involves numerous processing steps. A gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modem integrated circuit manufacture is to produce transistors having feature sizes as small as possible. Many modem day processes employ features, such as gate conductors and interconnects, which have less than 1.0 $\mu$m critical dimension. As feature size decreases, the sizes of the resulting transistor and the interconnect between transistors also decrease. Fabrication of smaller transistors allows more transistors to be placed on a single monolithic substrate, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

Another factor driving reduction of gate oxide thickness is the increased transistor drain current realized for a reduced gate dielectric thickness. Higher transistor drain currents are desirable because they allow each transistor to drive a greater number of other transistors, and can result in increased switching speeds. The transistor drain current is proportional to the amount of charge induced in the transistor channel region by the voltage applied to the gate conductor. The amount of charge induced by a given voltage drop across the gate oxide is the voltage drop multiplied by the capacitance of the oxide. Increasing the capacitance of the oxide therefore increases the transistor drain current. The capacitance C of the oxide can be written as for a parallel plate capacitor:

$$C = \in A / t_{ox},$$

where $\in$ is the permittivity of the oxide, A is its area, and $t_{ox}$ is the oxide thickness. The value of the capacitance is therefore dependent upon both the thickness and the permittivity of the gate oxide.

In order to achieve increased capacitance, gate oxide thickness has been reduced so much that current oxides are on the order of tens of angstroms thick. Unfortunately, thin oxide films may break down when subjected to an electric field. Particularly, for a gate oxide which is less than 50 Å thick, it is probable that even for a relatively low gate voltage of 3V, electrons can pass through the gate oxide by what is known as t he quantum mechanical tunneling effect. In this manner, a tunneling current may undesirably form between the semiconductor substrate and the gate conductor, adversely affecting the operability of the device. It is postulated that some of these electrons may become entrapped within the gate oxide by e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice.

A more promising approach to further increasing gate dielectric capacitance may be to increase the permittivity of the gate dielectric. Permittivity, $\in$, of a material reflects the ability of the material to be polarized by an electric field. The permittivity of a material is typically described as its permittivity normalized to the permittivity of a vacuum, $\in_o$. Hence, the relative permittivity or dielectric constant K of a material is defined as:

$$K = \in / \in_o$$

While oxide has a dielectric constant of approximately 4, other materials have higher K values. Silicon nitride ("nitride"), for example, has a K of about 6 to 9 (depending on formation conditions). Much higher K values of, for example, 20 or more can be obtained with various transition metal oxides including tantalum oxide ($Ta_2O_5$), barium strontium titanate ("BST"), and lead zirconate titanate ("PZT"). Using a high-K material for a gate dielectric would allow a high capacitance to be achieved even with a relatively thick dielectric. For example, a nitride gate dielectric having a thickness of 100 angstroms is substantially electrically equivalent to an oxide gate dielectric having a thickness of about 50 angstroms. For even higher-K dielectrics, even thicker gate dielectrics could be formed while maintaining capacitance values higher than are possible with even very thin oxide layers. In this way, the reliability problems associated with very thin dielectric layers may be avoided while transistor performance is improved.

Although the high-K values of the dielectrics described above make them attractive gate dielectric candidates, integration of these materials into a MOSFET does present problems. One of the most significant challenges with using a gate dielectric other than oxide is forming a dielectric/silicon interface having quality comparable to that of the silicon/$SiO_2$ interface. The interface between silicon and thermally grown oxide is believed to exhibit among the lowest known densities of interface states (energy levels which may trap electrons, resulting from defects such as dangling bonds) for a semiconductor/insulator interface. Thermally grown oxide also contains a relatively low density of trapping states within the oxide itself. These low trap densities are important to the ability to form devices having stable operating characteristics. A high density of traps increases the probability of charge trapping at the interface or within the dielectric during device operation. This charge trapping can lead to shifts in threshold voltage, as noted above.

It would therefore be desirable to develop a method for formation of a thin gate dielectric containing a high-K material. The desired gate dielectric, and the interface between the dielectric and underlying silicon, should have a low density of trapping states.

SUMMARY OF THE INVENTION

The problems outlined above are in large part addressed by a thin gate dielectric having a graded dielectric constant and a method for fabricating this gate dielectric by combining growth, deposition, annealing and etching processes. The gate dielectric may be used in semiconductor devices including, for example, transistors and dual-gate memory cells. A thin nitrogen-containing oxide, preferably having a thickness between about 4 angstroms and about 8 angstroms, is grown on a semiconductor substrate in embodiments for which a transistor is to be formed. In embodiments for which a memory cell is to be formed, the nitrogen-containing oxide may be grown on a polysilicon layer which is first deposited over a gate dielectric on the semiconductor substrate. In one embodiment, a thin nitride layer, preferably between about 15 angstroms and about 30 angstroms thick, is formed over the nitrogen-containing oxide. The substrate is subsequently annealed, first in an ammonia ($NH_3$) ambient, and then in a nitrous oxide ($N_2O$) ambient. A flowing-gas etch of the nitride layer is performed to achieve a nitride thickness of between about 5 angstroms and about 10 angstroms. The growth, deposition, annealing and etching recited above are preferably performed in-situ in a "cluster tool" such as those commonly used in the semiconductor industry. Cluster tools include chambers grouped together so that multiple deposition, etching, or other processes can be performed sequentially without exposing substrates to room air in the interim between the processes. This is desirable because room air exposure may cause particulate contamination and/or unwanted oxidation.

The nitrogen-containing oxide is preferably thermally grown on a silicon substrate, and typically contains less than about 6 atomic percent nitrogen as grown. Such a thermally grown nitrogen-containing oxide is believed to form a high-quality interface with the silicon substrate, similar to that of thermally grown oxide. The nitrogen incorporated into the oxide is believed to increase its dielectric constant slightly and improve the resistance of the oxide to impurity diffusion. The nitride layer may be deposited onto the nitrogen containing oxide by various techniques, including low-pressure chemical vapor deposition (LPCVD), plasma-enhanced chemical vapor deposition (PECVD), and sputtering. In addition to having a dielectric constant approximately twice that of oxide, nitride is known to form an effective barrier to diffusion of impurities such as boron, commonly used to dope silicon in p-channel transistors. If lower-temperature processes such as PECVD and sputtering are used, the deposited nitride may be non-stoichiometric and/or contain significant incorporated hydrogen. Incorporated hydrogen can form weak Si—H bonds which may be broken during device operation, leaving dangling bonds which can act as traps.

The $NH_3$ and $N_2O$ anneals performed subsequent to the nitride deposition are believed to alleviate the above problems with the nitride, in addition to improving the properties of the underlying nitrogen-containing oxide layer. The $NH_3$ anneal is believed to enhance the nitrogen concentration of the nitrogen-containing oxide layer, helping to increase the dielectric constant of this layer and its resistance to impurity diffusion. Furthermore, the $NH_3$ anneal may improve the stoichiometry of the nitride layer by increasing its nitrogen content. The $N_2O$ anneal is believed to reduce the trap density of the nitrogen-containing oxide and nitride layers. It is postulated that some of the traps in these layers are caused by hydrogen incorporated during nitride deposition or the $NH_3$ anneal. The $N_2O$ anneal may result in the displacement of incorporated hydrogen by oxygen. The Si—O bonds which may result from such a displacement are believed to be stronger than Si—H bonds and less likely to be broken during device operation.

The flowing gas etch process performed after nitride deposition allows the formation of a thinner nitride than can typically be reliably deposited using conventional dielectric deposition techniques such as CVD. The etch may be performed in-situ, in a gas ambient such as hydrochloric acid (HCl) combined with $H_2$, and at a substrate temperature between about 500° C. and about 900° C. It is contemplated that the nitride etch rate is more predictable if the etch process is performed subsequent to the $NH_3$ and $N_2O$ anneals. The etch process may also be performed before these anneals, however. This may be desirable in order to reduce the density of any traps which may be introduced by the presence of hydrogen during the etch process.

The layered dielectric formed by the combination of the nitrogen-containing oxide and nitride layers is preferably between about 10 angstroms and 20 angstroms thick. Because of the higher-K nitride component, however, the dielectric is electrically equivalent to an oxide having a thickness between about 7 angstroms and about 15 angstroms. The dielectric is believed to exhibit a low trap density, as evidenced by capacitance-voltage measurements, and a high resistance to dopant impurity diffusion. The high capacitance of the dielectric is further believed to result in high transistor drive currents and faster transistors.

In an alternative embodiment of the method recited herein, a different high-K material, such as a transition metal oxide, may be deposited in place of the nitride layer. This may allow formation of a dielectric with an even higher capacitance, equivalent to an even thinner oxide layer. Alternatively, a higher-K material may be deposited onto the etched nitride layer recited herein to form a multilayer dielectric. Adding an additional layer to those already present, no matter how high the dielectric constant of the additional layer, cannot increase the overall capacitance of the dielectric, because each additional layer represents a capacitance connected in series with the capacitances of the underlying layers. Such an additional high-K layer may nonetheless be beneficial by, for example, increasing the thickness of a dielectric (and possibly its reliability) without significantly lowering the overall capacitance.

After formation of the gate dielectric, device formation is continued with deposition and patterning of a gate conductor. Dopant impurity distributions are typically introduced into the semiconductor substrate, self-aligned to the patterned gate conductor. Particularly in the case of MOSFET formation, dielectric spacers may be subsequently formed adjacent to sidewalls of the gate conductor. A second dopant impurity introduction may then be performed, with the resulting impurity distributions self-aligned to lateral sidewalls of the spacers. These impurity introductions combine to form source and drain regions having lightly doped drain (LDD) regions beneath the spacers. A self-aligned silicide ("salicide") process may be carried out to form suicides on the upper surfaces of the gate, source and drain. Interconnect formation is then performed using additional dielectric and conductor deposition and patterning, as is known in the art.

In addition to the method described above, a semiconductor device is contemplated herein. In one embodiment, the device is a transistor having a graded-K gate dielectric interposed between a gate conductor and a semiconductor substrate. The gate dielectric includes a thermally-grown nitrogen-containing oxide combined with nitride and/or a different high-K material. The thermally-grown nitrogen-containing oxide is adjacent to the semiconductor substrate. The graded-K dielectric is contemplated to have a low density of trap states and a negligible concentration of dopant impurities diffused from nearby semiconductor regions. In an alternate embodiment, a polysilicon gate conductor over a gate dielectric is interposed between the nitrogen-containing oxide layer and the semiconductor substrate such that a dual-gate memory cell is formed.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 1:
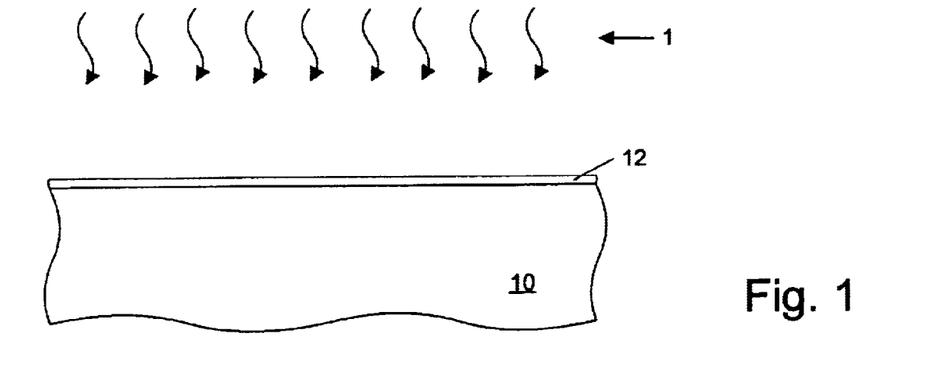
FIG. 1 is a partial cross-sectional view of a semiconductor topography including a semiconductor substrate and a nitrogen-containing oxide.

Turning to the drawings, FIG. 1 illustrates a partial cross-section of a semiconductor topography including an ultrathin (from about 4 angstroms to about 8 angstroms thick) nitrogen-containing oxide 12 formed upon a semiconductor substrate 10. Semiconductor substrate 10 is preferably silicon, and is doped either n-type (for producing a p-channel transistor) or p-type (for an n-channel transistor). More specifically, substrate 10 may be an epitaxial silicon layer grown on a monocrystalline silicon substrate, or an n-type or p-type well region formed in a monocrystalline silicon substrate. The method recited herein may also be suitable for other semiconductors, such as, for example, gallium arsenide. Although not shown, there may be dielectric isolation regions formed within substrate 10 to prevent electrical interaction between subsequently-formed semiconductor devices. Methods of forming the isolation regions may include dielectric deposition to fill trenches etched into the substrate or local oxidation of silicon. Nitrogen-containing oxide 12 is preferably grown using thermal process 1 illustrated in FIG. 1. Thermal process 1 includes heating substrate 10 to a temperature of greater than about 700° C. in an ambient containing both oxygen and nitrogen. Appropriate ambients may include, for example $N_2O$, NO, $NH_3+O_2$, $NH_3+NO$, $N_2+O_2$, and/or other gases or gas mixtures containing oxygen and nitrogen. Thermal process 1 is preferably performed in an apparatus capable of heating and cooling semiconductor substrates extremely rapidly; heating and cooling times should be a few seconds or less. Such an apparatus is commonly termed a rapid thermal annealing, or RTA, system. For growth of the extremely thin oxide layer recited herein, growth time may be between about 2 seconds and about 20 seconds.

Thermal growth of nitrogen-containing oxide 12 is believed to provide a lower density of interface trap states than does deposition of oxide 12 on substrate 10. Deposition process are also contemplated to be more difficult to control than growth processes when forming ultrathin layers. However, deposition of nitrogen-bearing oxide 12 by, for example, CVD may also be possible, particularly if RTA methods are used. In addition to the method recited above, oxide 12 may be thermally grown in an oxidizing ambient, and subsequently exposed to a nitrogen-bearing ambient to form a nitrogen-containing oxide. Before formation of oxide 12, the upper surface of substrate 10 should be carefully cleaned. A standard cleaning procedure employed for silicon substrates, known as the RCA method, after the laboratory at which it was formulated, may be used before oxide 12 is formed. An RCA clean involves oxidation of a silicon substrate in solutions which combine either an acid or a base with hydrogen peroxide, and subsequent removal of the oxide using a hydrofluoric acid (HF) solution. A final HF dip may be performed before substrate 10 is loaded into a chamber or furnace for formation of nitrogen-containing oxide 12. Formation of oxide 12 is preferably performed in a chamber associated with a cluster tool, so that the thermal processes, depositions, and etch processes included in the method recited herein may be performed in-situ without exposure of the substrate to room air.

Figure 2:
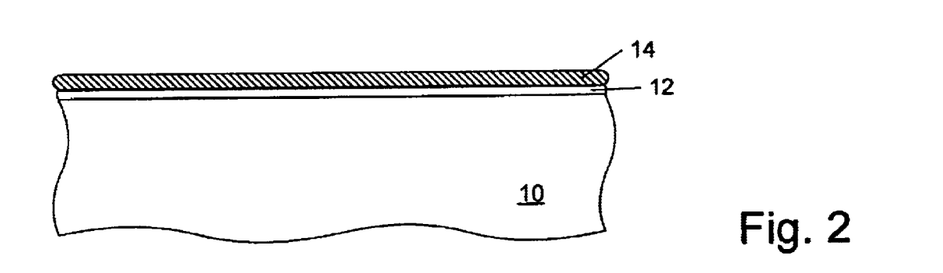
FIG. 2 is a partial cross-sectional view of the semiconductor topography, wherein a high-K dielectric is formed over the nitrogen-containing oxide, subsequent to the oxide formation of FIG. 1.

High-K dielectric 14 is subsequently deposited over oxide 12, as shown in FIG. 2. In a preferred embodiment, dielectric 14 is a nitride layer from about 15 angstroms to about 30 angstroms thick. This nitride may be deposited by various techniques, including LPCVD at a temperature between about 650° C. and 900° C., PECVD at a temperature between about 200° C. and 500° C., and sputtering at a temperature between about 50° C. and 350° C. LPCVD-deposited nitrides are typically more stoichiometric and contain less hydrogen than those deposited by PECVD. Nitride films grown by LPCVD, however, have relatively high levels of tensile stress, which may lead to defects. Stress in PECVD films, on the other hand, can be controlled by altering deposition conditions such as radio frequency (RF) power, gas flow rate, and RF frequency. Problems with stoichiometry and/or hydrogen content which may occur with nitride films deposited by low-temperature techniques such as PECVD or sputtering may be alleviated by the annealing processes discussed in the description of FIG. 3 below. In an alternative embodiment, high-K dielectric 14 shown in FIG. 2 may be formed not from nitride but from a different high-K dielectric, such as a metal oxide having a K value of 20 or more. High-K dielectric 14 may be formed from, for example, metal oxide materials such as $Ta_2O_5$, BST, and PZT. These materials may be deposited using CVD techniques, or by other methods such as sputtering.

Figure 3:
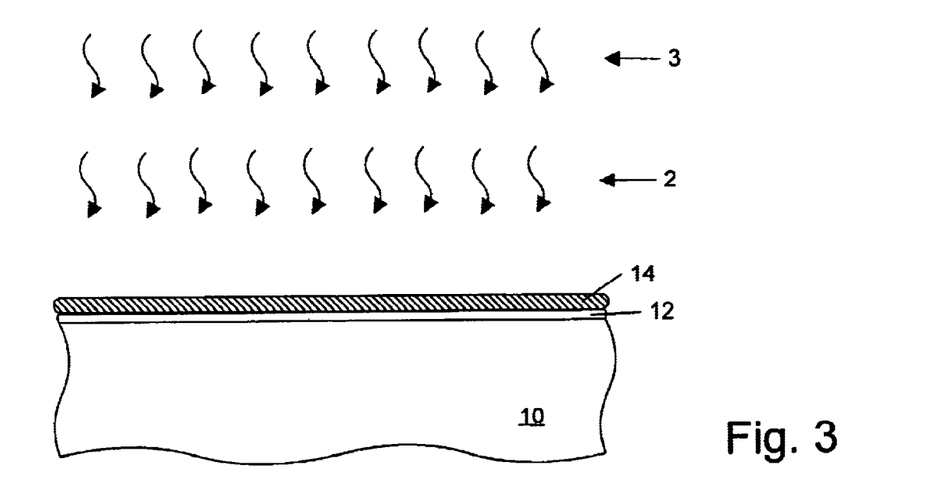
FIG. 3 is a partial cross-sectional view of the semiconductor topography wherein an $NH_3$ anneal and an $N_2O$ anneal are performed, subsequent to the high-K dielectric formation of FIG. 2.

Thermal processes 2 and 3 are subsequently performed on substrate 10, as shown in FIG. 3. Thermal process 2 involves heating substrate 10 to a temperature greater than about 750° C. in an ambient containing $NH_3$. This $NH_3$ anneal is believed to increase the nitrogen concentration of the nitrogen-containing oxide, thereby increasing its K value slightly and making it more resistant to dopant impurity interdiffusion. In the event that high-K dielectric 14 is formed from nitride, its nitrogen concentration may also be enhanced by thermal process 2. For nitrides deposited at low temperature, the nitrogen ambient of the anneal may improve the nitride stoichiometry, since low-temperature nitrides may be silicon-rich. Thermal process 2 is preferably performed using an RTA apparatus, for a time between about 5 seconds and about 60 seconds. Thermal process 3 is performed subsequent to thermal process 2, and involves heating substrate 10 to a temperature greater than about 800° C. in an ambient containing $N_2O$. Thermal process 3 is believed to help stabilize trap states associated with oxide 12 and high-K dielectric 14. Some of these traps may result from hydrogen introduced during nitride deposition (if high-K dielectric 14 is nitride) and/or during thermal process 2. Oxygen introduced by the $N_2O$ anneal may passivate or replace Si—H bonds associated with this hydrogen. In embodiments for which high-K dielectric 14 is a metal oxide material, thermal process 3 may advantageously reduce the concentration of oxygen vacancies in dielectric 14.

Figure 4:
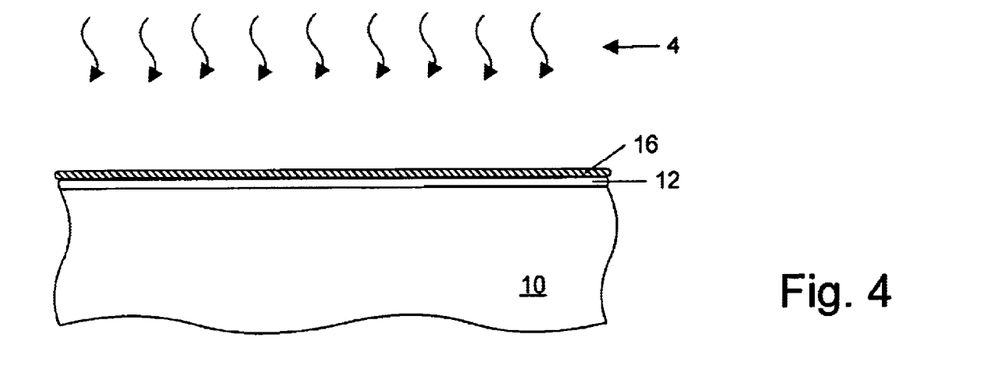
FIG. 4 is a partial cross-sectional view of the semiconductor topography, wherein a portion of the high-K dielectric is removed, subsequent to the high-K dielectric formation of FIG. 2.

The thickness of high-K dielectric 14 may be reduced by using an in-situ flowing gas etch, represented by thermal process 4 in FIG. 4. High-K dielectric 16 is the portion of dielectric 14 remaining after etching. Thermal process 4 includes heating substrate 10 to a temperature greater than about 500° C. in a gas ambient which slowly etches high-K dielectric 14. In embodiments for which dielectric 14 is nitride, suitable ambients may include $HCl+H_2$, nitric acid ($HNO_3$)+$H_2$, or sulfur tetrafluoride ($SF_4$)+argon. $H_2$ alone may also be suitable, although with a lower etch rate than for the above ambients. When formed from nitride, resulting high-K dielectric 16 is preferably between about 5 angstroms and 10 angstroms thick. Nitrogen-containing oxide 12 therefore combines with nitride 16 to form a two-layer graded-K gate dielectric between about 9 angstroms and 18 angstroms thick. This is electrically equivalent to an oxide thickness between about 7 angstroms and about 15 angstroms, but the graded-K dielectric may be more resistant to breakdown than an oxide of this thickness.

If a different high-K material, such as a metal oxide, is used for dielectric 14, different etch ambients may be necessary if it is desired to reduce the dielectric thickness. If the high-K material has a large enough dielectric constant, reduction of the thickness of dielectric 14 may not be needed. In this case, oxide 12 and high-K dielectric 14 would combine to form a graded-K dielectric. The improved stoichiometry and stabilization of oxide 12 and high-K dielectric 14 which are contemplated to result from thermal processes 2 and 3 may result in a more stable and predictable etch rate. This may make it advantageous for an etch using thermal process 4 to be performed subsequent to thermal processes 2 and 3 of FIG. 3. Alternatively, thermal process 4 of FIG. 4 may be performed prior to thermal process 3. In this way, any traps associated with hydrogen which may be introduced during thermal process 4 may be passivated by thermal process 3.

Figure 5:
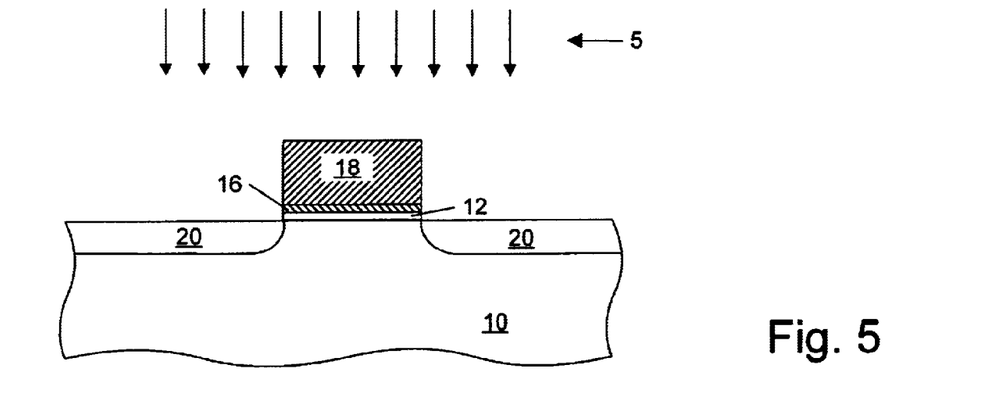
FIG. 5 is a partial cross-sectional view of the semiconductor topography, wherein a gate conductor is patterned upon the high-K dielectric and dopant impurities are introduced into the substrate, subsequent to the dielectric portion removal of FIG. 4.

Gate conductor 18 is subsequently formed over the graded-K gate dielectric, as shown in FIG. 5. Impurity distributions 20 may subsequently be introduced into substrate 10, self-aligned to sidewalls of gate conductor 18. Impurity introduction process 5, preferably an ion implantation, is used to introduce impurity distributions 20, which are of opposite type than substrate 10. For an n-channel transistor, for example, substrate 10 is p-type and distributions 20 are n-type. Typical n-type dopants include arsenic and phosphorus, while boron is a typical p-type dopant. If source and drain impurity distributions 20 are introduced by ion implantation, a subsequent anneal is performed in order to activate the impurities and repair damage to substrate 10. Gate conductor 18 is preferably formed from a polysilicon layer or any conductive (or to be rendered conductive) material capable of withstanding high temperature cycles. A polysilicon layer to be patterned into gate conductor 18 may be deposited using chemical vapor deposition (CVD) of silicon from, for example, a silane source. Such a CVD process may alternatively result in an amorphous silicon layer, particularly if low substrate temperatures are used. Gate conductor 18 may be formed from such an amorphous silicon layer, or other conductive materials which can withstand subsequent processing (such as that needed to form transistor source and drain regions) may also be used. Particularly for embodiments in which high-K dielectric 16 is formed from a metal oxide, high-temperature metals which are resistant to oxidation, such as platinum, iridium, or ruthenium, may be suitable for formation of gate conductor 18.

Gate conductor 18 is patterned from a conductive layer deposited upon high-K dielectric 16 by lithography and etching techniques known in the art. In the embodiment of FIG. 5, portions of oxide 12 and dielectric 16 not covered by gate conductor 18 are removed during its patterning. Alternatively, oxide 12 and dielectric 16 may be left unpatterned so that the upper surface of substrate 10 is protected during subsequent processing. Because nitrogen-containing dielectrics are thereby in place during introduction and annealing of impurity distributions 20, such an embodiment may help prevent outdiffusion of impurities from distributions 20. Boron in particular is known to be prone to diffusing into overlying oxide layers (such as native oxides which might be formed during processing).

Figure 6:
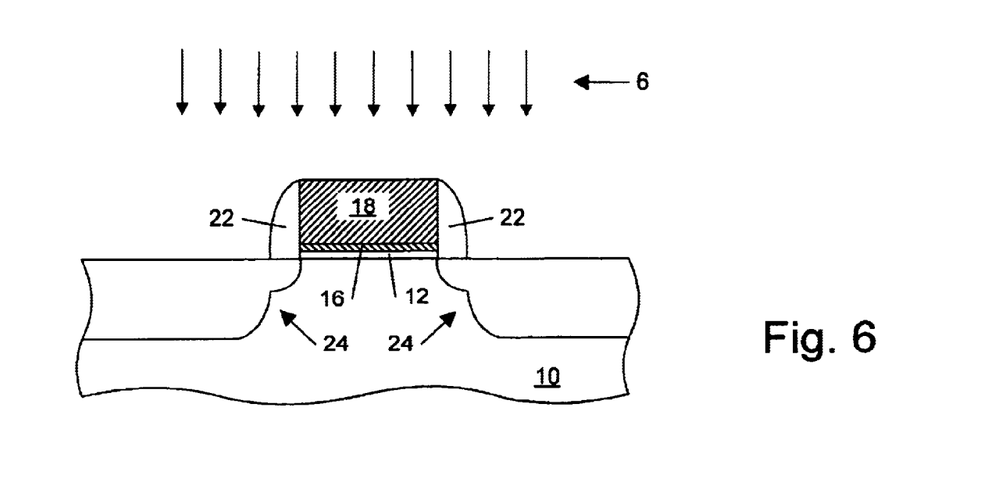
FIG. 6 is a partial cross-sectional view of the semiconductor topography, wherein dielectric spacers are formed and additional dopant impurities are introduced, subsequent to the impurity introduction of FIG. 5.

Turning now to FIG. 6, dielectric spacers 22 may be formed on sidewalls of gate conductor 18. Such spacers are typically formed by depositing a conformal dielectric layer over gate conductor 18 and substrate 10, and subsequently removing substantially horizontal portions of the dielectric layer to form spacers. Spacers 22 may be formed from oxide deposited by CVD. In particular, decomposition of tetraethyl orthosilicate (TEOS) may be performed in a PECVD reactor at a substrate temperature in the range from about 200° C. to about 500° C. to produce a very conformal film. Other techniques which may be used to deposit silicon dioxide for spacers 22 include PECVD using a silane source, and LPCVD or atmospheric-pressure CVD (APCVD) using silane or TEOS sources. Spacers 22 may also be formed from a different dielectric, such as silicon nitride or silicon oxynitride. The removal of horizontal portions of the deposited dielectric layer to form spacers 22 is preferably accomplished using an anisotropic etch process, typically an ion-assisted etching process, in which etching occurs more rapidly in a vertical direction than in a horizontal direction.

Subsequent to formation of spacers 22, dopant impurity introduction 6, preferably an ion implantation, may be performed as shown in FIG. 6. Impurity introduction 6 is preferably self-aligned to exposed lateral sidewalls of spacers 22 to form impurity regions which are deeper and more heavily doped than those formed by impurity introduction 5 shown in FIG. 5. The impurities introduced by process 6 are of the same type as those introduced by process 5. The impurity distributions formed using processes 5 and 6 combine to form source and drain regions 24. Source and drain 24 include comparatively lightly doped LDD portions under spacers 22. In the embodiment of FIG. 6, portions of oxide 12 and dielectric 16 not covered by gate conductor 18 are removed before formation of spacers 22. Alternatively, oxide 12 and dielectric 16 may be left unpatterned so the upper surface of substrate 10 is covered during impurity introduction 6. In this case, lower portions of spacers 22 would include portions of oxide 12 and dielectric 16. As noted in the description of FIG. 5 above, the presence of overlying nitrogen-containing dielectrics during formation and annealing of source and drain 24 may help prevent outdiffusion of impurities from source and drain 24.

The thin, high-quality graded-K gate dielectric of the transistor shown in FIG. 6 is believed to contribute to improved performance of the transistor. For example, the small thickness of the gate dielectric allows other dimensions of the transistor to be decreased as well. Smaller transistor dimensions in turn allow higher-density integrated circuits to be achieved. Furthermore, the contemplated low density of trapping states in the gate dielectric may prevent threshold voltage shifts during transistor operation. In addition, the increased capacitance of the gate dielectric increases the transistor drive current and thereby the speed of the transistor.

Figure 7:
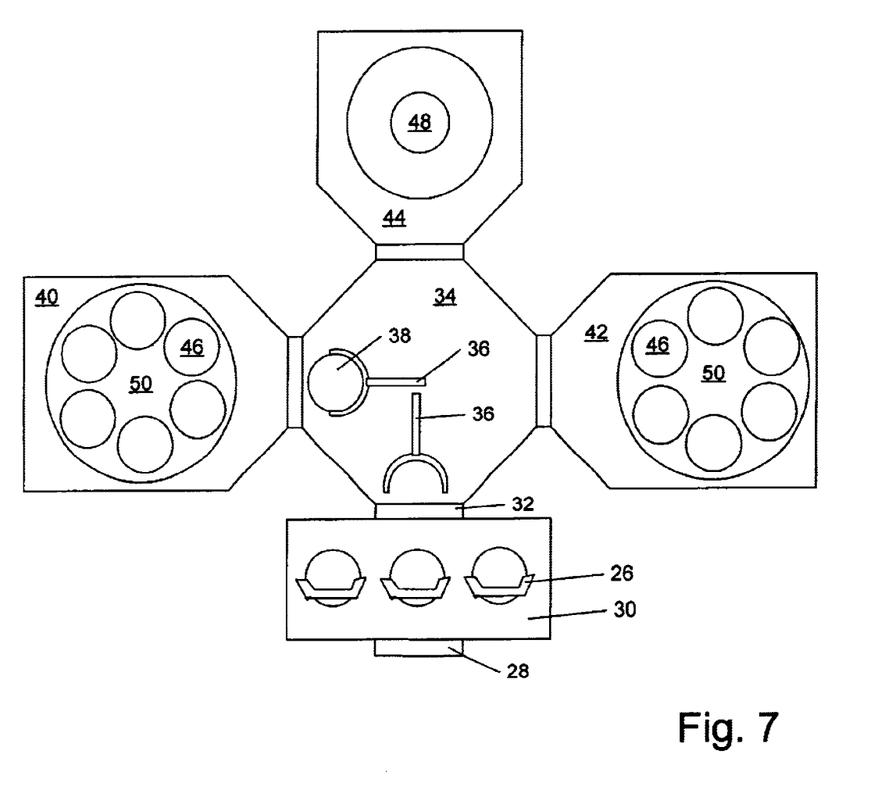
FIG. 7 is a cross-sectional top view showing the layout of an exemplary cluster tool including two deposition chambers and a heating chamber which are mutually connected and separate from an ambient outside the cluster tool.

The graded-K gate dielectric formation of FIGS. 1–4 is preferably performed in-situ in a cluster tool environment, as noted above. A cross-sectional top view showing an exemplary cluster tool arrangement that might be used for the embodiment of FIGS. 1–4 is shown in FIG. 7. A group of substrates is stacked in wafer cassette 26. Cassette 26 is loaded through valve 28 into loadlock/entry chamber 30 of the cluster tool. Valve 32 connects loadlock chamber 30 to transfer chamber 34. Transfer chamber 34 contains one or more substrate manipulators 36 which can remove a substrate from cassette 26 and transfer it to a substrate mounting position in an attached chamber. Although shown here as forks which fit under and/or around a substrate such as substrate 38, a substrate manipulator 36 could take other forms. For example, a vacuum wand which uses a vacuum to grip a substrate might be used. Substrate manipulators 36 are configured for movement in various ways so that substrates may be moved in and out of the attached chambers. Forms of movement employed might include rotation, translation along a track, and telescoping to become longer or shorter. Chambers attached to transfer chamber 34 in the embodiment of FIG. 7 include deposition chambers 40 and 42 and heating chamber 44. Deposition chambers 40 and 42 are each equipped with six substrate mounting positions 46, while heating chamber 44 has one mounting position 48.

Cluster tools such as that shown in FIG. 7 provide substantial flexibility in process sequences and conditions which may achieved without exposing a substrate to the ambient outside the cluster tool. For example, a showerhead for introduction of reactant gases is typically positioned above each of substrate mounting positions 46 in deposition chambers 40 and 42. RF voltages may be applied to the showerhead and/or to substrate mounting surface 50 as may be needed for plasma deposition or etching processes. Parameters such as gas composition and flow rate and RF power configuration may typically be controlled independently for each substrate mounting position 46. The growth, deposition, annealing and etch processes used to form the graded-K dielectric recited herein may therefore all be performed using a cluster tool such as that of FIG. 7. This may be accomplished by moving substrate 10 into and out of the associated chambers, or possibly by performing all of the processes in a single chamber.

Figure 8:
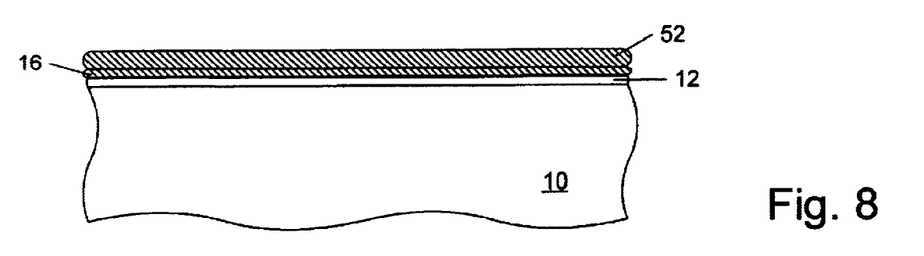
FIG. 8 is a partial cross-sectional view of the semiconductor topography in an alternative embodiment, wherein an additional high-K dielectric is formed, subsequent to the high-K dielectric formation of FIG. 2.

Turning now to FIG. 8, an alternative embodiment of the process recited herein is shown in which additional high-K dielectric 52 is formed upon high-K dielectric 16, subsequent to the formation of dielectric 16 in FIG. 4. In this embodiment, dielectric 16 is formed from nitride, and additional high-K dielectric 52 has a higher dielectric constant than that of nitride. Additional dielectric 52 preferably has a dielectric constant greater than about 20. In this way, a three-layer graded-K dielectric is formed. Although the capacitance of this dielectric cannot be larger than that of the two-layer gate dielectric of FIG. 6, additional dielectric 52 may advantageously increase the thickness and resistance to breakdown of the multilayer dielectric. The large K value of dielectric 52 allows the capacitance of the three-layer dielectric to be only slightly lower than that of the dielectric formed by oxide 12 and nitride 16.

Figure 9:
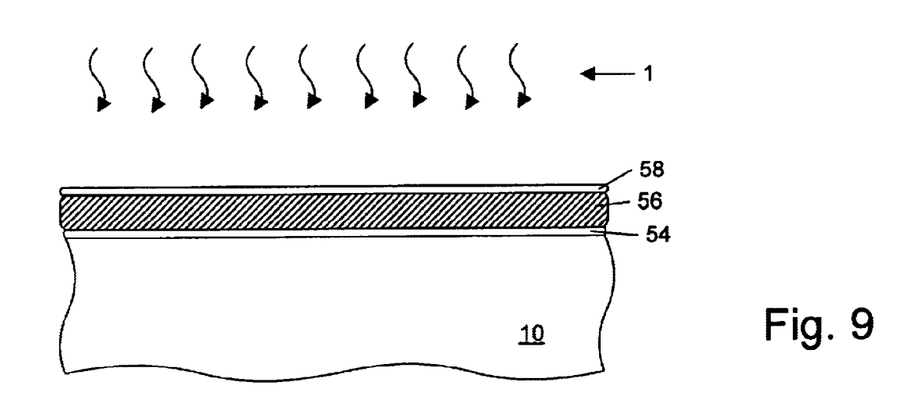
FIG. 9 is a partial cross-sectional view of the semiconductor topography in an alternative embodiment, wherein a gate dielectric and gate conductor layer are formed on the substrate prior to formation of a nitrogen-containing oxide.

In an alternative embodiment shown in FIG. 9, gate dielectric 54 and conductive layer 56 are formed over substrate 10 before formation of a nitrogen-containing oxide layer using thermal process 1. Gate dielectric 54 is preferably grown by heating substrate 10 to a temperature of greater than about 700° C. in an oxidizing ambient to grow oxide. Other gate dielectrics may be used, however, including silicon nitride, nitrided oxide, silicon oxynitride, and deposited oxide. Conductive layer 56 is preferably a polysilicon layer deposited using chemical vapor deposition (CVD) of silicon from, for example, a silane source. Such a CVD process may alternatively result in an amorphous silicon layer, particularly if low substrate temperatures are used. An amorphous silicon layer may also be used for conductive layer 56, and other materials which can withstand subsequent processing (such as that needed to form source and drain regions) may also be used. Polysilicon or amorphous silicon used to form conductive layer 56 includes dopant atoms, added either during or after deposition, to make the layer conductive. In embodiments for which layer 56 is formed from silicon, nitrogen-containing oxide 58 may be grown upon layer 56 in a similar manner as described for formation of oxide 12 in FIG. 1. If layer 56 is not formed from silicon, oxide 58 may be deposited, as also described for oxide 12.

Figure 10:
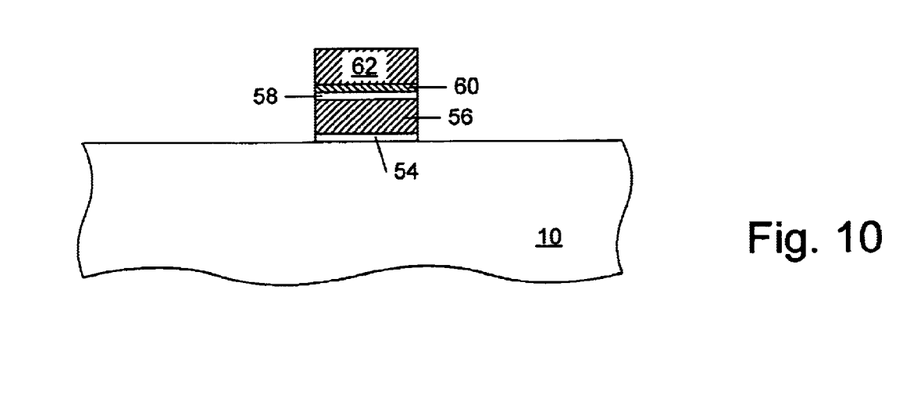
FIG. 10 is a partial cross-sectional view of the semiconductor topography, wherein a high-K dielectric and an additional gate conductor layer are formed, and a gate structure is patterned, subsequent to the oxide formation of FIG. 9.

After formation of nitrogen-containing oxide 58, a high-K dielectric is deposited in a similar manner as for formation of dielectric 14 in FIG. 2. The substrate is subsequently annealed using thermal processes 2 and 3 as shown in FIG. 3, and the high-K dielectric is etched using thermal process 4 as shown in FIG. 4. A gate conductor is then patterned over the high-K dielectric. These processes result in formation of upper gate conductor 62 and high-K dielectric 60, as shown positioned above nitrogen-containing oxide 58, lower gate conductor 56 and gate dielectric 54 in FIG. 10. The structure of FIG. 10 may form a portion of a dual-gate memory cell, such as a flash EEPROM. Device fabrication may be continued with processes including impurity introduction to form source and drain regions, and dielectric formation upon exposed surfaces of the floating gate electrode (typically a lower gate electrode such as conductor 56). The alternative embodiment of FIG. 8, in which a three-layer graded-K dielectric is formed, may also be applied to the structure of FIG. 10.

It will be appreciated to those skilled in the art having the benefit of this disclosure that this invention is believed to provide a method for forming a high-K gate dielectric having a low trap density and favorable interface properties with underlying semiconductor regions. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor device, comprising:
    a low-trap-density nitrogen-containing oxide arranged upon an upper surface of a semiconductor substrate;
    a high-K dielectric having a dielectric constant greater than about 5 arranged upon the nitrogen-containing oxide;
    a dielectric having a dielectric constant greater than about 20 arranged upon the high-K dielectric; and
    a conductor arranged above the high-K dielectric.

2. The device as recited in claim 1, wherein said high-K dielectric comprises silicon nitride.

3. The device as recited in claim 1, wherein said high-K dielectric comprises a material having a dielectric constant greater than about 20.

4. The device as recited in claim 1, further comprising:
    an additional conductor interposed between the nitrogen-containing oxide and the semiconductor substrate; and
    a dielectric arranged interposed between the additional conductor and the semiconductor substrate.

5. The device as recited in claim 1, wherein said nitrogen-containing oxide has a thickness of less than about 10 angstroms.

6. The device as recited in claim 2, wherein said silicon nitride has a thickness of less than or equal to about 10 angstroms.

7. The device as recited in claim 1, wherein said high-K dielectric comprises a metal oxide having a dielectric constant greater than about 20.

8. The device as recited in claim 1, wherein said high-K dielectric has a low-trap-density.

9. The device as recited in claim 1, wherein said low-trap-density nitrogen-containing oxide and said high-K dielectric form a gate dielectric, wherein said gate dielectric has a low-trap-density.

10. A semiconductor device, comprising:
    a low-trap-density nitrogen-containing oxide arranged upon an upper surface of a semiconductor substrate, wherein said low-trap-density nitrogen-containing oxide has a thickness of less than about 10 angstroms;
    a high-K dielectric having a dielectric constant greater than about 5 arranged upon the nitrogen-containing oxide, wherein said high-K dielectric has a thickness of less than or equal to about 10 angstroms; and
    a gate conductor arranged above the high K dielectric.

11. The device as recited in claim 10, wherein said high-K dielectric comprises silicon nitride.

12. The device as recited in claim 10, wherein said high-K dielectric comprises a material having a dielectric constant greater than about 20.

13. The device as recited in claim 10, wherein said high-K dielectric comprises a metal oxide having a dielectric constant greater than about 20.

14. The device as recited in claim 10, further comprising a dielectric having a dielectric constant greater than about 20 arranged upon the high-K dielectric.

15. The device as recited in claim 10, further comprising:
    an additional gate conductor interposed between the low-trap-density nitrogen-containing oxide and the semiconductor substrate; and
    a gate dielectric arranged interposed between the additional gate conductor and the semiconductor substrate.

16. The device as recited in claim 10, wherein said high-K dielectric has a low-trap-density.

17. The device as recited in claim 10, wherein said low-trap-density nitrogen-containing oxide and said high-K dielectric form a gate dielectric, wherein said gate dielectric has a low-trap-density.

18. A semiconductor device, comprising:
    a low-trap-density nitrogen-containing oxide arranged upon an upper surface of a semiconductor substrate;
    a high-K dielectric having a dielectric constant greater than about 5 arranged upon the nitrogen-containing oxide, wherein said high-K dielectric has a thickness of less than or equal to about 10 angstroms; and
    a conductor arranged above the high-K dielectric.

19. The device as recited in claim 18, wherein said high-K dielectric comprises silicon nitride.

20. The device as recited in claim 19, further comprising a dielectric having a dielectric constant greater than about 20 arranged upon the silicon nitride.

21. The device as recited in claim 18, wherein said high-K dielectric comprises a material having a dielectric constant greater than about 20.

22. The device as recited in claim 18, further comprising:
    an additional conductor interposed between the nitrogen-containing oxide and the semiconductor substrate; and
    a dielectric arranged interposed between the additional conductor and the semiconductor substrate.

23. The device as recited in claim 18, wherein said high-K dielectric comprises a metal oxide having a dielectric constant greater than about 20.

24. The device as recited in claim 18, wherein said high-K dielectric has a low-trap-density.

25. The device as recited in claim 18, wherein said low-trap-density nitrogen-containing oxide and said high-K dielectric form a gate dielectric, wherein said gate dielectric has a low-trap-density.

26. A semiconductor device, comprising:
    a low-trap-density nitrogen-containing oxide arranged upon an upper surface of a semiconductor substrate;
    a high-K dielectric having a dielectric constant greater than about 5 arranged upon the nitrogen-containing oxide, wherein said high-K dielectric has a thickness of less than or equal to about 10 angstroms; and
    a conductor arranged directly upon the high-K dielectric.

27. The device as recited in claim 26, wherein said high-K dielectric comprises silicon nitride.

28. The device as recited in claim 26, wherein said high-K dielectric comprises a material having a dielectric constant greater than about 20.

29. The device as recited in claim 26, further comprising:
    an additional conductor interposed between the nitrogen-containing oxide and the semiconductor substrate; and
    a dielectric arranged interposed between the additional conductor and the semiconductor substrate.

30. The device as recited in claim 26, wherein said high-K dielectric comprises a metal oxide having a dielectric constant greater than about 20.

31. The device as recited in claim 26, wherein said high-K dielectric has a low-trap-density.

32. The device as recited in claim 26, wherein said low-trap-density nitrogen-containing oxide and said high-K dielectric form a gate dielectric, wherein said gate dielectric has a low-trap-density.

33. The device as recited in claim 26, wherein said nitrogen-containing oxide has a thickness of less than about 10 angstroms.

* * * * *